ent Number: 5,114,885

Date of Patent: May 19, 1992

[54] ENCAPSULANT COMPOSITION

[75] Inventor: Jacob Hormadaly, Wilmington, Del.

[73] Assignee: E. I. Du Pont de Nemours and Company, Wilmington, Del.

[21] Appl. No.: 685,911

[22] Filed: Apr. 16, 1991

[51] Int. Cl.⁵ ............................................. C03C 3/074
[52] U.S. Cl. .................................... 501/76; 501/16; 501/20
[58] Field of Search .................. 501/76, 20, 16

[56] References Cited

U.S. PATENT DOCUMENTS

| | | | |
|---|---|---|---|
| 3,088,835 | 5/1963 | Pirooz | 106/53 |
| 3,113,878 | 12/1963 | Martin | 106/54 |
| 3,959,543 | 5/1976 | Ellis | 501/76 |
| 4,824,809 | 4/1989 | Grabowski et al. | 501/76 |

FOREIGN PATENT DOCUMENTS 616018 6/1976 Japan.

OTHER PUBLICATIONS

Derwent Publications Abstract—J52154-825 Jun. 18, 1976.

Primary Examiner—Mark L. Bell
Assistant Examiner—Deborah Jones

[57] ABSTRACT

A crystallizable glass composition comprising $ZnO$, $PbO$, $B_2O_3$, $SiO_2$, $SnO_2$ and optionally $Al_2O_3$ and/or $Cr_2O_3$.

11 Claims, No Drawings

ENCAPSULANT COMPOSITION

FIELD OF INVENTION

The invention relates to encapsulant compositions. In particular, the invention relates to low melting glass compositions which are suitable for use as encapsulants for electronic circuits.

BACKGROUND OF THE INVENTION

Hybrid circuits should be encapsulated to insure resistor durability in humid atmospheres. Furthermore, manufacturers prefer glass encapsulation to protect the conductor metals from long term corrosion.

The encapsulant system must exhibit several features which are difficult to achieve together. It must form a bubble-free seal at low enough firing temperature and prevent shift of the underlying resistors. If the glass flows too much, it will diffuse into the resistor and shift the value upward. If it does not flow enough, it will not seal. The organic vehicle necessary for screen printing must burn out at this low temperature. Thus an ideal encapsulant should screen print smoothly and rapidly with a vehicle which is decomposable at a low enough temperature to allow the glass to flow sufficiently to form a seal, but not so much as to shift the resistor.

Various glasses having low glass transition temperature (Tg) have been used extensively as encapsulants for electronic circuits. These glasses usually have had a high Temperature Coefficient of Expansion (TCE) which, unless it is carefully matched to the adjacent circuit layers, can set up substantial mechanical stresses which can lead to system failures.

An encapsulant, among its other functions, provides protection from the environments to the underlying electronic circuit. To fullfill this function the encapsulant should have sufficient durability to survive the environments encountered in the production and the daily use of the electronic circuits. Most low softening point glasses (referred to here as "low melting glasses") have poor durability in acids and bases and their durability tends to degrade as the glass transition temperature (Tg) becomes lower. Although the majority of electronic circuits are not expected to be used in very acidic or basic environments, some are exposed to water and basic or acidic environments during the production. The final stage in some fabrication processes involves an additional encapsulation by an organic polymer, e.g., an epoxy. Some epoxy resins contain an amine which can exert basic environment in humid atmosphere. Therefore, durabilities in boiling water and basic solutions (triethanol amino TEA, in water to simulate amines in epoxy) are detailed here.

To combat this problem, a glass has been suggested by Asahi Glass KK in JPA 52/154825, which is a crystallizable zinc-lead-borate type glass that undergoes crystallization when it is fired at 540°-560° C. and produces a crystallized overlay having a low TCE. Although the glass forms a dense overlay when fired at 540° C., the layer tends to be porous because of insufficient flow of the vitreous phase and excessive crystallization. It is, of course, desirable to be able to fire at a temperature in the 510°-560° C. range in order to avoid interaction of the glass with the underlying circuit components during the firing cycle. Therefore, there remains a real need for an encapsulating glass which (1) can be fired in the 510°-560° C. range to form a dense overlay, and (2) will form a dense overlay having good encapsulating properties.

SUMMARY OF THE INVENTION

The invention is therefore directed primarily to a crystallizable glass which is suitable as an encapsulant consisting essentially by weight of 15-34.5% ZnO, 41-65% PbO, 10-30% $B_2O_3$, 0.5-15% $SiO_2$, 0.5-10% $SnO_2$ and 0-7% $Al_2O_3$, $Cr_2O_3$ or mixtures thereof.

In a second aspect, the invention is directed to dispersions of the above-described glass or its compositional equivalents in an organic medium. By adjustment of the volatility of the solvent and the rheological properties of the dispersion, the composition of the invention can be used to form a green tape or it can be applied as a printable thick film paste.

PRIOR ART

The closest prior art of which applicant is aware at the time of filing this application is the following:

U.S. Pat. No. 3,088,835, Pirooz—The Pirooz patent is directed to a crystallizable sealing glass composition containing 38-42% ZnO, 10-14% $SiO_2$, 11-29% wt. PbO, 9-13% copper oxide, and up to 5% wt. of other glass forming oxides such as $B_2O_3$. The copper oxide is indicated to be essential for the purpose of adjusting the temperature coefficient of expansion of the composition.

U.S. Pat. No. 3,113,878, Martin—The Martin patent is directed to a crystallizable zinc silicoborate glass consisting of 60-70% ZnO, 19-25% $B_2O_3$ and 10-16% $SiO_2$ and optionally "minor amounts" of glass forming materials such as PbO, $As_2O_3$ and $Sb_2O_3$ and colorants. In particular, a glass is disclosed containing 60% ZnO, 22.5% $B_2O_3$, 12.5% $SiO_2$ and 5% PbO (Example 7). The glass is disclosed to be useful as a sealing glass for preformed materials having a Temperature Coefficient of Expansion (TCE) of $30-50 \times 10^{-7}$.

Japanese Kokai 61/6018, assigned to Asahi Glass- The patent is directed to a crystalline glass having a low melting point with the following composition by weight: 31-40% PbO, 35-50% ZnO, 10-20% $B_2O_3$, 2-6% $SiO_2$, 0-3% $SnO_2$ and 0-4% $TiO_2$. The glass is completely crystallized within 30 minutes upon heating to 500°-600° C. The crystallized product has a TCE of $43-55 \times 10^{-7}$ per °C. The glass is disclosed to be useful as a cover for thick film circuits. It is disclosed to be applied as a paste by printing or brushing.

DETAILED DESCRIPTION OF THE INVENTION

Because the encapsulant composition of the invention is used with fired resistors, it is necessary that the glass component be fired at a relatively low temperature such that the glass will incur only a minimum amount of diffusion into the resistor structure thereby minimizing interaction with the resistor. Thus the glass component of the encapsulant composition of the invention has been designed for use at a firing temperature of about 510°-560° C.

It has been found that complete crystallization of a separate phase throughout the encapsulated mass is not necessary. It is necessary only that crystallization take place at the interface of the fired resistor and the encapsulant layer in order to minimize glass flow at the interface. The crystallized glass phase has been determined to be a mixture of $PbZn_2B_2O_6$, $Zn_2SnO_4$, $ZnSnO_3$ and $Zn_2SiO_4$, of which the $PbZn_2B_2O_6$ is the major component. The crystallized glass has a different composition than both the parent glass (or glasses) and the remainder glass.

The composition of the invention is required to contain by weight at least 15% ZnO, but not more than 34.5%. If less than 15% ZnO is used, the composition will not crystallize sufficiently and the TCE is too high. On the other hand, if more than 34.5% ZnO is used, the amount of crystallization upon firing at 510°-560° C. is excessive. It is preferred that the ZnO be present within the range of 25-34.5%.

The PbO must be present in the composition of the invention in an amount of at least 40% but not more than 65%. If less than 40% PBO is used, the TCE of the glass is too high and the softening point of the glass becomes too low. It is preferred that the PbO be present in the glass within the range of 40-50%.

The $B_2O_3$ component is contained in the glass of the invention in amounts ranging from 10-30% by weight. The $B_2O_3$ serves an important function in the glass in that contributes significantly to the durability of the encapsulant layer. However, if more than 30% $B_2O_3$ is used, the TCE of the composition tends to become too high. On the other hand, if less than 10% $B_2O_3$ is used, the degree of crystallization during firing at 510°-560° C. tends to become excessive. It is preferred that the $B_2O_3$ be used within the range of 10-18% by weight.

Both the $SiO_2$ and $SnO_2$ are important in the composition of the invention because of their contribution to the durability (insolubility and hermeticity) of the glass. At least 0.5 of each must be used in order to get any significant technical effect. However, in order to avoid making the softening point of the glass too high, the amount of $SiO_2$ must not exceed 15% and the amount of $SnO_2$ must not exceed 10%. It is preferred that both the $SiO_2$ and $SnO_2$ be present within the composition of the invention each within the range of 1-8%.

In addition to the above-described essential components, the composition may optionally contain up to 7% by weight $Al_2O_3$ and/or $Cr_2O_3$. Small amounts of $Al_2O_3$ are added to facilitate glass formation when the glass is synthesized. The $Cr_2O_3$ functions in the glass mainly as a pigment. Both may be used in the glass up to a maximum of 7% by weight of each.

The surface area of the glass is not critical but is preferably in the range of 1.5-4 $m^2/g$. Assuming a density of approximately 3-4 $g/cm^2$, this range corresponds to an approximate particle size range of 0.5-1 micron. A surface area of 1.5 $m^2/g$ (approx. 1.3 micron) can also be utilized. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size.

The glasses are prepared by conventional glassmaking techniques by mixing the desired components in the desired proportions and heating the mixture to form a melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1½ hours. The melt is then poured into cold water. The maximum temperature of the water during quenching is kept as low as possible by increasing the volume of water to melt ratio. The crude frit after separation from water is freed from residual water by drying in air or by displacing the water by rinsing with methanol. The crude frit is then ball milled in water for 3-24 hours in alumina containers using alumina balls or it is jet milled.

After discharging the milled frit slurry, excess solvent is removed by decantation and the frit powder is air dried at room temperature. The dried powder is then screened through a 325-mesh screen to remove any large particles.

Is is preferred that the encapsulant glass compositions of the invention contain only the metal oxides discussed hereinabove. Nevertheless, it is recognized that small amounts, up to 5% wt., of other glass modifying oxides such as alkali metal oxides and alkaline earths can be added to the encapsulant compositions without changing their essential character.

The above-described procedure illustrates preparation of the glass of the invention by melting a mixture of the various metal oxides in the proportions set out hereinabove. However, the glass may also be made by mixing two or more amorphous glasses which together contain the metal oxides in the appropriate proportions or they may be made by mixing one or more amorphous glasses together with metal oxides to obtain the appropriate proportions of the metal oxides. In this regard, it is preferred to form the crystallizable glass of the invention by admixing two glasses having higher and lower melting points. A particularly useful mixture for making the glass of the invention has been found to be an admixture of an amorphous lead borosilicate glass containing a small amount of $Al_2O_3$ and $Cr_2O_3$ and an amorphous lead zinc borate glass containing $Al_2O_3$, $SiO_2$, $SnO_2$ and $Cr_2O_3$.

ORGANIC MEDIUM

Organic medium suitable for use in the invention are selected according to the physical form in which the encapsulant compositions are applied. In particular, the encapsulant glass frit can be applied as a thick film paste by screen printing and it can also be applied as a green tape.

When the encapsulant is applied by screen printing, the particles thereof are mixed with an inert liquid medium (vehicle) by mechanical mixing (e.g., on a roll mill) to form a pastelike composition having suitable consistency and rheology for screen printing. The latter is printed as a "thick film" in the conventional manner.

The main purpose of the organic medium is to serve as a vehicle for dispersion of the finely divided solids of the composition in such form that it can readily be applied to ceramic or other substrates. Thus the organic medium must first of all be one in which the solids are dispersible with an adequate degree of stability. Secondly, the rheological properties of the organic medium must be such that they lend good application properties to the dispersion.

Most thick film compositions are applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of liquids can be used as organic medium. The organic medium for most thick film compositions is typically a solution of resin in a solvent frequently also containing thixotropic agents and wetting agents. The solvents usually boil within the range of 130°-350° C.

Suitable solvents include kerosene, mineral spirits, dibutylphthalate, butyl carbitol, butyl carbitol acetate, hexylene glycol and high boiling alcohols and alcohol esters. Various combinations of these and other solvents are formulated to obtain the desired viscosity and volatility.

By far the most frequently used and a frequently preferred resin for this purpose is ethyl cellulose. However, resins such as ethylhydroxyethyl cellulose, wood rosin, mixtures of ethyl cellulose and phenolic resins, polymethacrylates of lower alcohols and monobutyl ether of ethylene glycol monoacetate can also be used.

In the past, poly(alpha-methyl styrene) has been utilized as a resin for thick film applications because of its excellent burn-out properties. However, poly(alpha-methyl styrene) has not been widely used because thick film pastes made therewith have exhibited very poor rheological properties. It has, however, been found when the encapsulant composition of the invention are formulated as thick film pastes using poly(alpha-methyl styrene) dissolved in dibutyl carbitol, the resulting paste has quite good rheological properties for screen printing. Thus, a preferred organic medium for formulating the encapsulant composition of the invention as a thick film paste is a solution of 20-60% wt. poly(alpha-methyl styrene) and 80-40% wt. dibutyl carbitol and preferably 45-55% wt. poly (alpha-methyl styrene) and 55-45% wt. dibutyl carbitol.

Among the thixotropic agents which are commonly used as hydrogenated castor oil and derivatives thereof and ethyl cellulose. It is, of course, not always necessary to incorporate a thixotropic agent since the solvent resin properties coupled with the shear thinning inherent in any suspension may alone be suitable in this regard. Suitable wetting agents include phosphate esters and soya lecithin.

The ratio of organic medium to solids in the paste dispersions can vary considerably and depends upon the manner in which the dispersion is to be applied and the kind of organic medium used. Normally, to achieve good coverage, the dispersions will contain complementally by weight 40-90% solids and 60-10% organic medium.

The pastes are conveniently prepared on medium (vehicle) utilized is determined mainly by the final desired formulation viscosity and print thickness.

It will be recognized that by adjusting the rheological properties of the dispersions of the invention and by changing the solvent component of the organic medium, the invention compositions can be applied to substrates by other methods than casting, e.g., by screen printing. When the compositions are applied by screen printing, the conventional organic media materials used for thick film materials can be used so long as the polymers are completely soluble therein at application temperatures.

TEST PROCEDURES

Laser Trim Stability—Laser trimming of thick film resistors is an important technique for the production of hybrid microelectronic circuits. ([A discussion can be found in *Thick Film Hybrid Microcircuit Technology* by D. W. Hamer and J. V. Biggers (Wiley, 19072, p. 173 ff.] Its use can be understood by considering that the resistances of a particular resistor printed with the same resistive ink on a group of substrates has a Gussian-like distribution. To make all the resistors have the same design value for proper circuit performance, a laser is used to trim resistances up by removing (vaporizing) a small portion of the resistor material. The stability of the trimmed resistor is then a measure of the fractional change in resistance that occurs after laser trimming. Low resistance change—high stability—is necessary so that the resistance remains close to its design value for proper circuit performance.

Shift on Aging at 150° C.—After initial measurement of resistance at room temperature, the resistor is placed into a heating cabinet at 150° C. in dry air and held at that temperature for a specified time (usually 1,000 hours). At the end of the specified time, the resistor is removed and allowed to cool to room temperature. The resistance is again measured and the change in resistance calculated by comparison with the initial resistance measurement.

Hermeticity—This test is performed in the same manner as the preceding Shift on Aging Test, except that the air within the heating cabinet is maintained at 85% relative humidity (RH) at 85° C. (85% RH/85° C.).

Resistance Measurement and Calculations—The test substrates are mounted on terminal posts within a controlled temperature chamber and electrically connected to a digital ohm-meter. The temperature in the chamber is adjusted and allowed to equilibrate, after which the resistance of the test resistor on each substrate is measured and recorded.

Silver Migration Resistance Test—The following procedure is used to test the compositions of the invention with respect to their capability to resist silver migration:

(1) A series of parallel thick film silver conductor lines is printed on a 96% $Al_2O_3$ substrate using a 325-mesh screen having 1.1 mil wire. The conductor pattern is then fired.

(2) An overglaze strip is printed over the conductor lines substrate using a 200-mesh screen having 1.6 mil wire. The patterned overglaze paste is fired at 500°-600° C. using a short 20-30 minutes firing cycle.

(3) A drop of deionized water is placed on the fired overglaze between the conductor lines and a 20 volt DC current is applied for 15 minutes.

(4) After applying current for 15 minutes, the assembly is examined under a microscope and examined visually. If any interaction is observed such as bubbles, staining or dendrite formation, the assembly is deemed to have failed the test, which is then terminated.

The above test is based upon procedures described by S. J. Krumbein in his article entitled Metallic Electromigration Phenomena in IEEE Transactions on Components, Hybrids and Manufacturing Technology, Vol. II, No. 1, March 1988.

Durability was measured as follows: Weighed 1×1 inch alumina substrates were screen printed with the desired overglaze, dried and subsequently fired at 560° C. peak temperature in a belt furnace. The fired part is then weighed again to record the net weight of the overglaze, after which it is subjected to boiling water for 5 hrs. or 1.49% TEA for 24 hrs. at room temperature (25 grams of 1.49% TEA solution were used for each 1×1 substrate, 50 g of distilled water were used for each 1×1 substrate in the boiling water test). After exposure to the test solution, the parts were rinsed with distilled water and dried in oven 120° C.±10° C. for ~16 hrs. Weights were recorded again to determine weight loss ($\Delta W$). All weight measurements were done on an analytical balance ±0.0001 g accuracy, so the accuracy in the measured $\Delta W$ is ±0.0003 g. Durability in boiling water for hours is outstanding for all compositions measured (Table I). Weight loss ranges were from 0.0001 g to 0.0005 g which is within experimental error. Durability in 1.49% TEA solution is given below.

EXAMPLES

In the following examples, the thick film pastes were prepared by admixing two thick film pastes the dispersed solids of which had the following compositions:

Paste A: Glass I containing 77% PbO, 12.5% $B_2O_3$, 9.1% $SiO_2$ and 1.4% $Al_2O_3$ plus $SiO_2$ and $Cr_2O_3$, the overall composition of the paste solids being 66.6% PbO, 10.8% $B_2O_3$, 1.2% $Al_2O_3$, 20.4% $SiO_2$ and 1.0% $Cr_2O_3$.

Paste B: Glass II containing 38.4% PbO, 38.3% ZnO, 17.3% $B_2O_3$, 0.8% $Al_2O_3$, 2.3% $SiO_2$ and 2.9% $SnO_2$ plus $Cr_2O_3$, the overall composition of the paste solids being 37.8% PbO, 37.6% ZnO, 17.0% $B_2O_3$, 0.8% $Al_2O_3$, 2.3% $SiO_2$, 2.8% $SnO_2$ and 1.9% $Cr_2O_3$.

EXAMPLES 1-5

A series of five encapsulant thick film pastes was prepared by blending Paste A with Paste B in increments by weight ranging from 10% to 50% Paste A and complementally from 90% to 50% Paste B. The composition of the paste blends and the TCE and durability in TEA properties of the fired encapsulant layers prepared therefrom are given in Table 1 below:

TABLE 1

| Example No. | 1 | 2 | 3 | 4 | 5 |
| --- | --- | --- | --- | --- | --- |
| Wt. Ratio, Paste A/Paste B | 10/90 | 20/80 | 30/70 | 40/60 | 50/50 |
| Component, % Wt. | | | | | |
| PbO | 40.6 | 43.4 | 46.4 | 49.2 | 52.1 |
| ZnO | 33.8 | 30.1 | 26.3 | 22.6 | 18.8 |
| $B_2O_3$ | 16.4 | 15.8 | 15.1 | 14.5 | 13.9 |
| $Al_2O_3$ | 0.8 | 0.8 | 0.9 | 0.9 | 1.0 |
| $SiO_2$ | 4.1 | 5.9 | 7.7 | 9.5 | 11.3 |
| $SnO_2$ | 2.5 | 2.3 | 2.0 | 1.7 | 1.4 |
| $Cr_2O_3$ | 1.8 | 1.7 | 1.6 | 1.5 | 1.5 |
| TCE ($\times 10^{-7}$/°C.) | 57.9 | 58.8 | 59.9 | 61.1 | 62.5 |
| $\Delta W$ (%) | 3.85 | 2.76 | 2.56 | 2.59 | 2.35 |

EXAMPLE 6

A glass was prepared from an admixture of metal oxides by the conventional glassmaking method described hereinabove in which the glass was melted at 1000° C. and fritted into distilled water. The frit was ball-milled for 16 hours and then dried overnight. The glass had the following composition by weight:

PbO: 45.3%
ZnO: 31.4
$SiO_2$: 3.5
$SnO_2$: 2.4
$B_2O_3$: 16.5
$Al_2O_3$: 0.9

A thick film paste was prepared from this glass using an ethyl cellulose, terpineol solvent organic medium. The TCE of the fired paste was $67 \times 10^{-7}$/°C. measured from room temperature to 300° C. and the durability test in triethanolamine indicated on average weight loss of only 3.25% after 24 hours. The fired layer contained no blisters and had outstanding Ag migration resistance.

EXAMPLE 7

A further glass was prepared from an admixture of metal oxides in the same manner as the glass of Example 6. The glass had the following composition by weight:

PbO: 43.0%
ZnO: 33.0
$SiO_2$: 2.3
$SnO_2$: 2.0
$B_2O_3$: 15.7
$Al_2O_3$: 4.0

A thick film paste was prepared from this glass using the same organic medium composition as for Example 6. The TCE of the fired paste was $65 \times 10^{-7}$/°C. measured from room temperature to 300° C. and the durability test in triethanolamine indicated an average weight loss of 5.74% after 19 hours. The fired layer contained no blisters and had excellent Ag migration resistance.

I claim:

1. An crystallizable glass composition consisting essentially of by weight % 15-34.5% ZnO, 41-65% PbO, 10-30% $B_2O_3$, 0.5-15% $SiO_2$, 0.5-10% $SnO_2$ and 0-7% $Al_2O_3$, $Cr_2O_3$ or mixtures thereof the TCE being at least $57.9 \times 10^{-7}$/°C. upon firing at 510°-560° C.

2. A thick film composition comprising finely divided particles of the glass of claim 1 dispersed in an organic medium.

3. A thick film composition comprising finely divided particles of a plurality of crystallizable glasses having higher and lower melting points, the overall composition of the glasses corresponding to the glass composition of claim 1.

4. The composition of claim 1 which has been fired at a temperature of 510°-560° C. to effect the formation of a plurality of crystalline phases which comprises in major amount $PbZn_2B_2O_6$ dispersed in a remnant glass.

5. The composition of claim 1 which contains 25-34.5% ZnO.

6. The composition of claim 1 which contains 41-50% PbO.

7. The composition of claim 1 which contains 10-18% $B_2O_3$.

8. A thick film paste comprising finely divided particles of the composition of claim 1 dispersed in an organic medium comprising a polymer dissolved in a volatile solvent.

9. A green tape comprising finely divided particles of the composition of claim 1 dispersed in organic medium comprising a solid polymer.

10. A thick film composition comprising an admixture of finely divided particles of lead borate glass, a lead borosilicate glass, $SiO_2$ and $Cr_2O_3$, the overall composition of the metal oxides in the components of the admixture corresponding to the composition of the metal oxides contained in the crystallizable glass composition of claim 1.

11. A thick film composition comprising an admixture of finely divided particles of amorphous crystallizable metal oxide-based glass and metal oxide(s), the overall proportions of the metal oxides from both components corresponding to the composition of the metal oxides contained in the crystallizable glass composition of claim 1.

* * * * *